United States Patent
Min et al.

(10) Patent No.: US 11,329,189 B2
(45) Date of Patent: May 10, 2022

(54) LIGHT EMITTING DIODE AND LIGHT EMITTING DEVICE HAVING THE SAME

(71) Applicant: LG Display Co., Ltd., Seoul (KR)

(72) Inventors: Hye Li Min, Paju-si (KR); So Mang Kim, Paju-si (KR)

(*) Notice: Subject to any disclaimer, the term of this patent is extended or adjusted under 35 U.S.C. 154(b) by 167 days.

(21) Appl. No.: 16/692,134

(22) Filed: Nov. 22, 2019

(65) Prior Publication Data
US 2020/0168763 A1    May 28, 2020

(30) Foreign Application Priority Data

Nov. 23, 2018 (KR) .......................... 10-2018-0146021

(51) Int. Cl.
| | |
|---|---|
| H01L 33/06 | (2010.01) |
| H01L 33/26 | (2010.01) |
| H01L 33/14 | (2010.01) |
| H01L 51/00 | (2006.01) |
| H01L 51/50 | (2006.01) |
| H01L 51/56 | (2006.01) |

(52) U.S. Cl.
CPC .............. *H01L 33/06* (2013.01); *H01L 33/14* (2013.01); *H01L 33/26* (2013.01); *H01L 51/004* (2013.01); *H01L 51/0094* (2013.01); *H01L 51/5072* (2013.01); *H01L 51/5088* (2013.01); *H01L 51/502* (2013.01)

(58) Field of Classification Search
CPC .... H01L 33/14; H01L 51/004; H01L 51/5072
See application file for complete search history.

(56) References Cited

U.S. PATENT DOCUMENTS

| | | | | |
|---|---|---|---|---|
| 2005/0074631 A1* | 4/2005 | Ishida | ................ | H01L 51/0058 428/690 |
| 2007/0013297 A1* | 1/2007 | Park | .................... | H01L 51/5278 313/506 |
| 2008/0007158 A1* | 1/2008 | Farooq | ................ | C08G 77/388 528/33 |
| 2010/0207513 A1* | 8/2010 | Begley | ................ | H01L 51/0054 313/504 |
| 2019/0229271 A1* | 7/2019 | Lee | ..................... | H01L 51/0059 |

FOREIGN PATENT DOCUMENTS

| | | |
|---|---|---|
| KR | 10-0642431 B1 | 11/2006 |
| KR | 10-2007-0074257 A | 7/2007 |

OTHER PUBLICATIONS

Daniele Costenaro, et al. "Preparation of luminescent ZnO nanoparticles modified with aminopropyltriethoxy silane for optoelectronic applications", New J. Chem., 2013, 37, 2103-2109, Published on Apr. 15, 2013.

* cited by examiner

*Primary Examiner* — Omar F Mojaddedi
(74) *Attorney, Agent, or Firm* — Polsinelli PC

(57) ABSTRACT

The present disclosure relates to a light emitting diode that includes a charge control layer disposed between a charge transfer layer and one electrode and including polysiloxane-based material chemically bonded to a surface of the charge transfer layer and a light emitting device having the same. The charge control layer is configured to remove a surface defect of the charge transfer layer, to transport charges stably, and to reflect a part of light passing through the charge transfer layer, and thereby enhancing out-coupling efficiency. In addition, the charge control layer regulates a charge flow from the electrode to the charge transfer layer, so that charges may be injected into an emitting material layer in a balanced manner.

17 Claims, 10 Drawing Sheets

LIGHT EMITTING DIODE AND LIGHT EMITTING DEVICE HAVING THE SAME

CROSS REFERENCE TO RELATED APPLICATION

This application claims the benefit of Korean Patent Application No. 10-2018-0146021, filed in Korea on Nov. 23, 2018, which is incorporated herein by reference in its entirety.

BACKGROUND

Field of the Disclosure

The present disclosure relates to a light emitting diode, and more specifically, to a light emitting diode enhancing charge mobility property and out-coupling efficiency and a light emitting device having the same.

Description of the Background

As electronic and information technologies progress rapidly, a field of displays for processing and displaying a large quantity of information has been developed rapidly. Accordingly, various flat panel display devices such as a liquid crystal display (LCD) device, an organic light emitting diode (OLED) display device, etc. have been developed. Among these flat panel display devices, OLED has come into spotlight as a next-generation display device replacing LCD since it enables thin structure and shows lower consumption power.

In case of increasing current densities or raising driving voltages in the OLED for improving luminance in OLED display device, the luminous life time of OLED become shorter owing to thermal degradation and deteriorations of organic materials in OLED. Besides, OLED has not achieved high color gamut required in ITU-R Recommendation BT.2020 (REC. 2020 or BT.2020) of International Telecommunication Union as regards 4K/UHD standards.

Recently, a display device using inorganic luminescent particles such as quantum dot (QD) has been developed. QD is an inorganic luminescent particle that emits light as unstable stated excitons shift from conduction band to valence band. QD has large extinction coefficient, high quantum yield among inorganic particles and generates strong fluorescence. Besides, since QD has different luminescence wavelengths as its sizes, it is possible to obtain light within the whole visible light spectra so as to implement various colors by adjusting sizes of QD.

When QD is used as a luminous material in an emitting material layer (EML), it is possible to enhance color purity of individual pixel and implement white (W) light consisting of high purity red (R), green (G) and blue (B) so as to achieve Rec.2000 standard. Accordingly, Quantum Dot Light emitting Diode (QLED) which uses QD as luminous material has come into spotlight.

Surface defects, which is generated at an interfaces between emissive layers or a surface of the emissive layers in the OLED and QLED, has been a limitation in realizing a desired level of luminous efficiency. In addition, since there is a charge un-balancing due to the relative mobility difference between the holes and electrons, the OLED and QLED shows reduced luminous efficiency. Moreover, a part of light generated from the emitting material layer is emitted toward other directions rather than an intended emitting direction, which causes an out-coupling efficiency to be reduced.

SUMMARY

Accordingly, the present disclosure is directed to a light emitting diode and a light emitting device having the diode that substantially obviates one or more of the problems due to the limitations and disadvantages of the related art.

More specifically, the present disclosure provides a light emitting diode that enhances charge mobility and out-coupling efficiency, and thereby improving luminous efficiency and a light emitting device having the diode.

In addition, the present disclosure provides a light emitting diode that can inject charges into an emitting material layer in a balanced manner and a light emitting device having the diode.

Additional features and advantages of the disclosure will be set forth in the description which follows, and in part will be apparent from the description, or may be learned by practice of the disclosure. The other advantages of the disclosure will be realized and attained by the structure particularly pointed out in the written description and claims hereof as well as the appended drawings.

According to an aspect, the present disclosure provides a light emitting diode that comprises first and second electrodes facing each other, a charge transfer layer disposed between the first and second electrodes and including an inorganic material and a charge control layer, wherein the charge control layer includes a polysiloxane-based material bonded chemically to a surface of the charge transfer layer.

According to another aspect, the present disclosure provides a light emitting diode that comprises first and second electrodes facing each other, an emitting material layer disposed between the first and second electrodes, a first charge transfer layer disposed between the first electrode and the emitting material layer; a second charge transfer layer disposed between the emitting material layer and the second electrode and including an inorganic material and a charge control layer, wherein the charge control layer includes a polysiloxane-based material bonded chemically to a surface of the second charge transfer layer.

According to still another aspect, the present disclosure provides a light emitting device that comprises a substrate and the light emitting diode over the substrate, as described above.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate implementations of the disclosure and together with the description serve to explain the principles of aspects of the disclosure.

In the drawings.

DETAILED DESCRIPTION

Reference will now be made in detail to aspects of the disclosure, examples of which are illustrated in the accompanying drawing.

Figure 1:
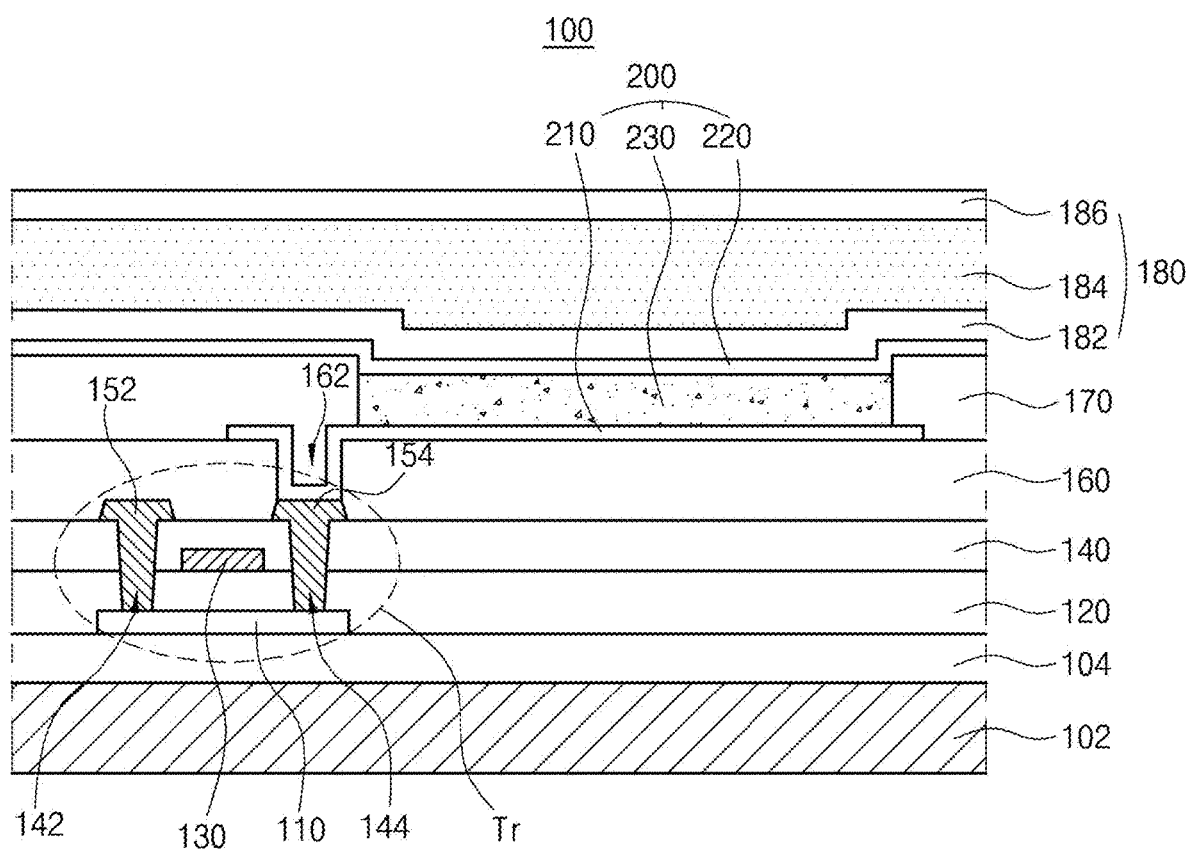
FIG. 1 is a schematic cross-sectional view illustrating a light emitting diode display device in accordance with the present disclosure.

The light emitting diode of the present disclosure includes a charge control layer that includes a polysiloxane-based material chemically bonded to a surface of a charge transfer layer so as to solve the problems and disadvantages accompanied by the prior art. The light emitting diode may be applied to a light emitting device such as a light emitting diode display device and a light emitting diode illumination device. FIG. 1 is a schematic cross-sectional view illustrating a light emitting diode display device in accordance with the present disclosure.

As illustrated in FIG. 1, a light emitting diode display device 100 includes a substrate 102, a thin film transistor Tr over the substrate 102 and a light emitting diode 200 connected to the thin film transistor Tr. The thin film transistor Tr includes a semiconductor layer 110, a gate electrode 130, a source electrode 152 and a drain electrode 154.

The substrate 102 may include, but are not limited to, glass, thin flexible material and/or polymer plastics. For example, the flexible material may be selected from the group, but are not limited to, polyimide (PI), polyethersulfone (PES), polyethylenenaphthalate (PEN), polyethylene terephthalate (PET), polycarbonate (PC) and combination thereof. The substrate 102, over which The thin film transistor Tr and the light emitting diode 200 are arranged, form an array substrate.

A buffer layer 104 may be disposed over the substrate 102, and the thin film transistor Tr is disposed over the buffer layer 104. The buffer layer 104 may be omitted.

A semiconductor layer 110 is disposed over the buffer layer 104. In one exemplary aspect, the semiconductor layer 110 may include, but are not limited to, oxide semiconductor materials. In this case, a light-shied pattern (not shown) may be disposed under the semiconductor layer 110, and the light-shield pattern (not shown) can prevent light from being incident toward the semiconductor layer 110, and thereby preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 formed of an insulating material is disposed on the semiconductor layer 110. The gate insulating layer 120 may include, but are not limited to, an inorganic insulating material such as silicon oxide (SiOx) or silicon nitride (SiNx).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 1, the gate insulating layer 120 may be patterned identically as the gate electrode 130.

An interlayer insulating layer 140 formed of an insulating material is disposed on the gate electrode 130 with covering over an entire surface of the substrate 102. The interlayer insulating layer 140 may include, but are not limited to, an inorganic insulating material such as silicon oxide (SiOx) or silicon nitride (SiNx), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over both sides of the gate electrode 130 with spacing apart from the gate electrode 130. The first and second semiconductor layer contact holes 142 and 144 are formed within the gate insulating layer 120 in FIG. 1. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, each of which includes a conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 1 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and source and drain electrodes are disposed over the semiconductor layer. In this case, the semiconductor layer may include, but are not limited to, amorphous silicon.

Although not shown in FIG. 1, a gate line and a data line, which cross each other to define a pixel region, and a switching element, which is connected to the gate line and the data line, may be further formed in the pixel region. The switching element is connected to the thin film transistor Tr, which is a driving element. Besides, a power line is spaced apart in parallel from the gate line or the data line, and the thin film transistor Tr may further includes a storage capacitor configured to constantly keep a voltage of the gate electrode for one frame.

In addition, the light emitting display device 100 may include a color filter (not shown) for absorbing a light emitted from the organic light emitting diode 200. For example, the color filter (not shown) may absorb a light of specific wavelength such as red (R), green (G) or blue (B). In this case, the light emitting display device 100 can implement full-color through the color filter (not shown).

For example, when the light emitting display device 100 is a bottom-emission type, the color filter (not shown) may be disposed on the interlayer insulating layer 140 with corresponding to the light emitting diode 200. Alternatively, when the light emitting display device 100 is a top-emission type, the color filter (not shown) may be disposed over the light emitting diode 200, that is, a second electrode 220.

A passivation layer 160 is disposed on the source and drain electrodes 152 and 154 over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The light emitting diode 200 includes a first electrode 210 that is disposed on the passivation layer 160 and connected to the drain electrode 154 of the thin film transistor Tr. The organic light emitting diode 200 further includes an emission layer 230 as an emitting unit and a second electrode 220 each of which is disposed sequentially on the first electrode 210.

The first electrode 210 is disposed in each pixel region. The first electrode 210 may be an anode and include a conductive material having relatively high work function value. For example, the first electrode 210 may include, but are not limited to, a doped or undoped metal oxide such as indium-tin-oxide (ITO), indium-zinc-oxide (IZO), indium-tin-zinc oxide (ITZO), indium-copper-oxide (ICO), tin oxide (SnO2), indium oxide (In2O3), cadmium:zinc oxide (Cd:ZnO), fluorine:tin oxide (F:SnO2), indium:tin oxide (In:SnO2), gallium:tin oxide (Ga:SnO2) or aluminum:zinc oxide (Al:ZnO; AZO). Optionally, the first electrode 210 may include a metal or nonmetal material such as nickel (Ni), platinum (Pt), gold (Au), silver (Ag), iridium (Ir) or a carbon nanotube (CNT), other than the above-described metal oxide.

In one exemplary aspect, when the light emitting display device 100 is a top-emission type, a reflective electrode or a reflective layer (not shown) may be disposed under the first electrode 210. For example, the reflective electrode or the reflective layer (not shown) may comprise, but are not limited to, aluminum-palladium-copper (APC) alloy.

In addition, a bank layer 170 is disposed on the passivation layer 160 in order to cover edges of the first electrode 210. The bank layer 170 exposes a center of the first electrode 210.

Figure 2:
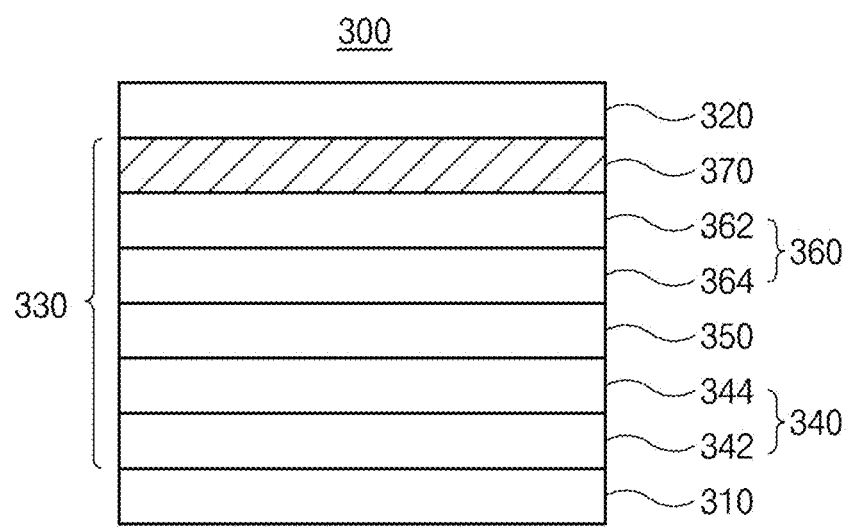
FIG. 2 is a schematic cross-sectional view illustrating a light emitting diode in accordance with the present disclosure.

An emission layer 230 is disposed on the first electrode 210. In one exemplary aspect, the emission layer 230 may have a mono-layered structure of an emitting material layer. Alternatively, the emission layer 230 may have a multiple-layered structure of a first charge transfer layer 340, an emitting material layer 350, a second charge transfer layer 360 and a charge control layer 370, as illustrated in FIG. 2. The configuration and locations of those layers in the emission layer 230 will be explained in more detail below.

The second electrode 220 is disposed over the substrate 102 above which the emission layer 230 is disposed. The second electrode 220 may be disposed over a whole display area, may include a conductive material having a relatively low work function value compared to the first electrode 210, and may be a cathode. For example, the second electrode 220 may include, but are not limited to, Ca, Ba, Ca/Al, LiF/Ca, LiF/Al, BaF2/Al, CsF/Al, CaCO3/Al, BaF2/Ca/Al, Al, Mg, Au:Mg or Ag:Mg.

In addition, an encapsulation film 180 may be disposed over the second electrode 220 in order to prevent outer moisture from penetrating into the light emitting diode 200. The encapsulation film 180 may have, but are not limited to, a laminated structure of a first inorganic insulating film 182, an organic insulating film 184 and a second inorganic insulating film 186.

FIG. 2 is a cross-sectional view illustrating a light emitting diode in accordance with the present disclosure. As illustrated in FIG. 2, the light emitting diode (LED) 300 in accordance with the present disclosure includes a first electrode 310, a second electrode 320 facing with the first electrode 310, and an emission layer 330 as an emitting unit between the first and second electrodes 310 and 320.

As an example, the emission layer 330 includes an emitting material layer EML 350. In addition, the emission layer 330 further includes a first charge transfer layer (CTL1) 340 disposed between the first electrode 310 and the EML 350, a second charge transfer layer (CTL2) 360 disposed between the EML 350 and the second electrode 320 and including an inorganic material and a charge control layer (CCL) 370 disposed between the CTL2 360 and the second electrode 320.

The first electrode 310 may be an anode such as a hole injection electrode. The first electrode 310 may be located over a substrate (not shown in FIG. 2) that may be a glass or a polymer. As an example, the first electrode 310 may include, but are not limited to, a doped or undoped metal oxide such as indium-tin-oxide (ITO), indium-zinc-oxide (IZO), indium-tin-zinc oxide (ITZO), indium-copper-oxide (ICO), tin oxide (SnO2), indium oxide (In2O3), cadmium:zinc oxide (Cd:ZnO), fluorine:tin oxide (F:SnO2), indium:tin oxide (In:SnO2), gallium:tin oxide (Ga:SnO2) or aluminum:zinc oxide (Al:ZnO; AZO). Optionally, the first electrode 210 may include a metal or nonmetal material such as nickel (Ni), platinum (Pt), gold (Au), silver (Ag), iridium (Ir) or a carbon nanotube (CNT), other than the above-described metal oxide.

The second electrode 320 may be a cathode such as an electron injection electrode. As an example, the second electrode 320 may include, but are not limited to, Ca, Ba, Ca/Al, LiF/Ca, LiF/Al, BaF2/Al, CsF/Al, CaCO3/Al, BaF2/Ca/Al, Al, Mg, Au:Mg or Ag:Mg. As an example, each of the first electrode 310 and the second electrode 320 may have a thickness of, but are not limited to, about 30 to about 300 nm.

In one exemplary aspect, when the LED 300 is a bottom emission-type light emitting diode, the first electrode 310 may include, but are not limited to, a transparent conductive metal oxide such as ITO, IZO, ITZO or AZO, and the second electrode 320 may include, but are not limited to, Ca, Ba, Ca/Al, LiF/Ca, LiF/Al, BaF2/Al, Al, Mg, or an Ag:Mg alloy.

The CTL1 340 is disposed between the first electrode 310 and the EML 350. In this exemplary aspect, the CTL1 340 may be a hole transfer layer that provides holes into the EML 350. As an example, the CTL1 340 may include a hole injection layer (HIL) 342 disposed adjacently to the first electrode 310 between the first electrode 310 and the EML 350, and a hole transport layer (HTL) 344 disposed adjacently to the EML 350 between the first electrode 3410 and the EML 350.

The HIL 342 facilitates the injection of holes from the first electrode 310 into the EML 350. As an example, the HIL 342 may include, but are not limited to, an organic material selected from the group consisting of poly(ethylenedioxythiophene):polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the HIL 342 may include the dopant such as F4-TCNQ in about 1 to about 30% by weight. The HIL 342 may be omitted in compliance with a structure of the LED 300.

The HTL 344 transport holes from the first electrode 310 into the EML 350. The HTL 344 may include an inorganic material or an organic material. As an example, when the HTL 344 includes an organic material, the HTL 344 may include, but are not limited to, 4,4'-bis(p-carbazolyl)-1,1'-biphenyl compounds such as 4,4'-N,N'-dicarbazolyl-biphenyl (CBP); aromatic amines, i.e. aryl amines or polynuclear aromatic amines selected from the group consisting of N,N'-diphenyl-N,N'-bis(1-naphtyl)-1,1'-biphenyl-4,4"-diamine (α-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), 4,4',4"-tris(N-carbazolyl)-triphenylamine (TCTA), tetra-N-phenylbenzidine (TPB), tris(3-methylphenylphenylamino)-triphenylamine (m-MTDATA), poly(9,9'-dioctylfluorenyl-2,7-diyl)-co-(4,4'-(N-(4-sec-butylphenyl) diphenylamine (TFB), poly(4-butylphenyl-dipnehyl amine) (poly-TPD) and combination thereof; conductive polymers such as polyaniline, polypyrrole, PEDOT:PSS; poly(N-vinylcarbazole) (PVK) and its derivatives; poly(para)phenylene vinylenes (PPV) and its derivatives such as poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); polymethacrylate and its derivatives; poly(9,9-octylfluorene) and its derivatives; poly(spiro-fluorene) and its derivatives; metal complexes such as copper phthalocyanine (CuPc); and combination thereof.

Alternatively, when the HTL 344 includes an inorganic material, the HTL 344 may include, but are not limited to, a metal oxide such as NiO, MoO3, Cr2O3, Bi2O3 or p-type ZnO; a non-oxide equivalent such as copper thiocyanate (CuSCN), Mo2S, or p-type GaN; and combination thereof.

In FIG. 2, while the CTL1 340 is divided into the HIL 342 and the HTL 344, the CTL1 340 may have a mono-layered structure. For example, the CTL1 340 may include only the HTL 344 without the HIL 342 or may include the above-mentioned hole transporting material doped with the hole injection material (e.g. PEDOT:PSS).

The CTL1 340 including the HIL 342 and the HTL 344 may be laminated by any vacuum deposition process such as vacuum vapor deposition and sputtering, or by any solution process such as spin coating, drop coating, dip coating, spray coating, roll coating, flow coating, casting, screen printing and inkjet printing, or a combination thereof. For example, each of the HIL 342 and the HTL 344 may have a thickness, but are not limited to, between about 10 nm and 200 nm, alternatively, about 10 nm and 100 nm.

The EML 350 may include inorganic luminescent particles or organic luminous material. As an example, the EML 350 may include the inorganic luminescent particles such as quantum dots (QDs) or quantum rods (QRs). QDs or QRs are inorganic luminescent particles each of which emits light as unstable charge excitons drop from the conduction band energy level to the valence band energy level. These inorganic luminescent particles have very large extinction coefficient, high quantum yield among inorganic particles and generates strong fluorescence. In addition, these inorganic luminescent particles shows different luminescence wavelengths as its sizes, it is possible to emit lights within the whole visible light spectra so as to implement various colors by adjusting sizes of these inorganic luminescent particles. When these inorganic luminescent particles such as QDs and/or QRs are used as a luminous material in the EML 350, it is possible to enhance color purity in individual pixel region and to realize White (W) light consisting of red (R), green (G) and blue (B) light having high color purity.

In one exemplary aspect, QDs or QRs may have a single-layered structure. In another exemplary aspect, QDs or QRs may have a multiple-layered heterologous structure, i.e. core/shell structure. In this case, each of the core and the shell may have a single layer or multiple layers, respectively. The reactivity of precursors forming the core and/or shell, injection rates of the precursors into a reaction vessel, reaction temperature and kinds of ligands bonded to an outer surface of those inorganic luminescent particles such as QDs or QRs may have affects upon the growth degrees, crystal structures of those inorganic luminescent particles. As a result, it is possible to emit lights of various luminescent wavelength ranges, as the energy level bandgap of those inorganic luminescent particles are adjusted.

In one exemplary aspect, inorganic luminescent particles (e.g. QDs and/or QRs) may have a type I core/shell structure where an energy level bandgap of the core is within an energy level bandgap of the shell. In case of using the type I core/shell structure, electrons and holes are transferred to the core and recombined in the core. Since the core emits light from exciton energies, it is possible to adjust luminance wavelengths by adjusting sizes of the core.

In another exemplary aspect, the inorganic luminescent particles (e.g. QDs and/or QRs) may have type II core/shell structure where the energy level bandgap of the core and the shell are staggered and electrons and holes are transferred to opposite directions among the core and the shell. In case of using the type II core/shell structure, it is possible to adjust luminescence wavelengths as the thickness and the energy bandgap locations of the shell.

In still another exemplary aspect, the inorganic luminescent particles (e.g. QDs and/or QRs) may have reverse type I core/shell structure where the energy level bandgap of the core is wider than the energy level bandgap of the shell. In case of using the reverse type I core/shell structure, it is possible to adjust luminescence wavelengths as thickness of the shell.

As an example, when the inorganic luminescent particle (e.g. QDs and/or QRs) has a type-I core/shell structure, the core is a region where luminescence substantially occurs, and a luminescence wavelength of the inorganic luminescent particle is determined as the sizes of the core. To achieve a quantum confinement effect, the core necessarily has a smaller size than the exciton Bohr radius according to material of the inorganic luminescent particle, and an optical bandgap at a corresponding size.

The shell of the inorganic luminescent particles (e.g. QDs and/or QRs) promotes the quantum confinement effect of the core, and determines the stability of the particles. Atoms exposed on a surface of colloidal inorganic luminescent particles (e.g. QDs and/or QRs) having only a single structure have lone pair electrons which do not participate in a chemical bond, unlike the internal atoms. Since energy levels of these surface atoms are between the conduction band edge and the valence band edge of the inorganic luminescent particles (e.g. QDs and/or QRs), the charges may be trapped on the surface of the inorganic luminescence particles (e.g. QDs and/or QRs), and thereby resulting in surface defects. Due to a non-radiative recombination process of excitons caused by the surface defects, the luminous efficiency of the inorganic luminescence particles may be degraded, and the trapped charges may react with external oxygen and compounds, leading to a change in the chemical composition of the inorganic luminescence particles, or to a permanent loss of the electrical/optical properties of the inorganic luminescent particles.

To effectively form the shell on the surface of the core, a lattice constant of the material in the shell needs to be similar to that of the material in the core. As the surface of the core is enclosed by the shell, the oxidation of the core may be prevented, the chemical stability of the inorganic luminescence particles (e.g. QDs and/or QRs) may be enhanced, and the photo-degradation of the core by an external factor such as water or oxygen may be prevented. In addition, the loss of excitons caused by the surface trap on the surface of the core may be minimized, and the energy loss caused by molecular vibration may be prevented, thereby enhancing the quantum efficiency.

In one exemplary aspect, each of the core and the shell may include, but are not limited to, a semiconductor nanocrystals and/or metal oxide nanocrystals having quantum confinement effect. For example, the semiconductor nanocrystals of the core and the shell may be selected from the group, but are not limited to, consisting of Group II-VI compound semiconductor nanocrystals, Group III-V compound semiconductor nanocrystals, Group IV-VI compound semiconductor nanocrystals, Group I-III-VI compound semiconductor nanocrystals and combination thereof.

Particularly, Group II-VI compound semiconductor nanocrystals of the core and/or the shell may be selected from the group, but are not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof.

Group III-V compound semiconductor nanocrystals of the core and/or shell may be selected from the group, but are not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystals of the core and/or shell may be selected from the group, but are not limited to, consisting of TiO2, SnO2, SnS, SnS2, SnTe, PbO, PbO2, PbS, PbSe, PbTe, PbSnTe and combination thereof. Also, Group I-III-VI compound semiconductor nanocrystals of the core and/or shell may be selected from the group, but are not limited to, AgGaS2, AgGaSe2, AgGaTe2, AgInS2, CuInS2, CuInSe2, Cu2SnS3, CuGaS2, CuGaSe2 and combination thereof. Alternatively, each of the core and the shell may independently include multiple layers each of which has different Groups compound semiconductor nanocrystals, e.g., Group II-VI compound semiconductor nanocrystals and Group III-V compound semiconductor nanocrystals such as InP/ZnS, InP/ZnSe, GaP/ZnS, and the likes, respectively.

In another aspect, the metal oxide nanocrystals of the core and/or shell may include, but are not limited to, Group II or Group III metal oxide nanocrystals. As an example, the metal oxide nanocrystals of the core and/or the shell may be selected from the group, but are not limited to, MgO, CaO, SrO, BaO, Al2O3 and combination thereof.

The semiconductor nanocrystals of the core and/or the shell may be doped with a rare earth element such as Eu, Er, Tb, Tm, Dy or an arbitrary combination thereof or may be doped with a metal element such as Mn, Cu, Ag, Al or an arbitrary combination thereof.

As an example, the core in QDs or QRs may include, but are not limited to, ZnSe, ZnTe, CdSe, CdTe, InP, ZnCdS, CuxIn1-xS, CuxIn1-xSe, AgxIn1-xS and combination thereof. The shell in QDs or QRs may include, but are not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, CdXZn1-xS and combination thereof.

In another exemplary aspect, the inorganic luminescent particle may include, but are not limited to, alloy QD or alloy QR such as homogenous alloy QD or QR or gradient alloy QD or QR, e.g. CdSxSe1-x, CdSexTe1-x, CdXZn1-xS, ZnxCd1-xSe, CuxIn1-xS, CuxIn1-xSe, AgxIn1-xS.

When the EML 350 includes inorganic luminescent particles such as QDs and/or QRs, the EML 350 may be laminated through solution process, i.e. coating the dispersion solution, which contains inorganic luminescent particles dissolved in a solvent, on the CTL1 340, for example the HTL 344, and evaporating the solvent. The EML 350 may be laminated on the CTL1 340 using any solution process such as spin coating, drop coating, dip coating, spray coating, roll coating, flow coating casting, screen printing and inkjet printing, or a combination thereof. The EML 350 may have a thickness, but are not limited to, between about 5 nm and 300 nm, alternatively, about 10 nm and 200 nm.

In one exemplary aspect, the EML 350 may include inorganic luminescent particles such as QDs and/or QRs having photoluminescence (PL) wavelength peaks of 440 nm, 530 nm, and 620 nm so as to realize white LED. Optionally, the EML 350 may include inorganic luminescent particles such as QDs or QRs having any one of red, green and blue colors, and may be formed to emit any one color.

In an alternative aspect, the EML 350 may include organic luminous material. The organic luminous material is not limited to a specific organic luminous material. As an example, the EML 350 may include organic luminous material that emits red (R), green (G) or blue (B) light, and may include fluorescent material or phosphorescent material. As an example, the organic luminous material in the EML 350 may include a host and a dopant. When the organic luminous material constitutes a host-dopant system, the EML 350 may include the dopant, but are not limited to, in about 1 to about 50% by weight, and alternatively, in about 1 to about 30% by weight.

The organic host, which can be used in the EML 350, is not limited to specific organic luminous material. As an example, the organic host in the EML 350 may include, but are not limited to, Tris(8-hydroxyquinoline)aluminum (Alq3), TCTA, PVK, 4,4'-bis(N-carbazolyl)-1,1'-biphenyl (CBP), 4,4'-Bis(9-carbazolyl)-2,2'-dimethylbiphenyl (CDBP), (9,10-di(naphthalene-2-yl)anthracene (ADN), 3-tert-butyl-9,10-di(naphtha-2-yl)anthracene (TBADN), 2-methyl-9,10-bis(naphthalene-2-yl) anthracene (MADN), 1,3,5-tris(N-phenylbenzimidazole-2-yl)benzene (TPBi), distyrylarylene (DSA), mCP and/or 1,3,5-tris(carbazol-9-yl) benzene (TCP).

In one exemplary aspect, when the EML 350 emits red light, the dopant in the EML 350 may include, but are not limited to, an organic compound and/or a metal complex such as 5,6,11,12-tetraphenylnaphthalene (Rubrene), (Bis(2-benzo[b]-thiophene-2-yl-pyridine)(acetylacetonate)iridium (III) (Ir(btp)2(acac)), Bis[1-(9,9-diemthyl-9H-fluorn-2-yl)-isoquinoline](acetylacetonate)iridium(III) (Ir(fliq)2(acac)), Bis[2-(9,9-diemthyl-9H-fluorn-2-yl)-quinoline](acetylacetonate)iridium(III) (Ir(flq)2(acac)), Bis-(2-phenylquinoline)(2-(3-methylphenyl)pyridinate)irideium(III) (Ir(phq) 2typ) and/or Iridium(III)bis(2-(2,4-difluorophenyl) quinoline)picolinate (FPQIrpic).

In another exemplary aspect, when the EML 350 emits green light, the dopant in the EML 350 may include, but are not limited to, an organic compound and/or a metal complex such as N,N'-dimethyl-quinacridone (DMQA), coumarine 6, 9,10-bis[N,N-di-(p-tolyl)amino]anthracene (TTPA), 9,10-bis[phenyl(m-tolyl)-amino]anthracene (TPA), bis(2-phenylpyridine)(acetylacetonate)iridium(I) (Ir(ppy)2(acac)), fac-tris(phenylpyridine)iridium(III) (fac-Ir(ppy)3) and/or tris[2-(p-tolyl)pyridine]iridium(III) (Ir(mppy)3).

In still another exemplary aspect, when the EML 350 emits blue right, the dopant in the EML 350 may include, but are not limited to, an organic compound and/or a metal complex such as 4,4'-bis[4-(di-p-tolylamino) styryl]biphenyl (DPAVBi), perylene, 2,5,8,11-tetra-tert-butylpherylene (TBPe), bis(3,5-difluoro-2-(2-pyridyl)phenyl-(2-carbozylpyridyl)iridium(II) (FirPic), mer-tris(1-phenyl-3-methylimidazolin-2ylidene-C,C2')iridium(III (mer-Ir(pmi) 3) and/or tris(2-(4,6-difluorophenyl)pyridine)iridium(II) (Ir (Fppy)3).

Alternatively, when the EML 350 includes an organic luminous material, the EML 350 may include a delayed fluorescent material.

When the EML 350 includes an organic luminous material, the EML 350 may be laminated by any vacuum deposition process such as vacuum vapor deposition and sputtering, or by any solution process such as spin coating, drop coating, dip coating, spray coating, roll coating, flow coating, casting, screen printing and inkjet printing, or a combination thereof. For example, the EML 350 may have a thickness, but are not limited to, between about 5 nm and 300 nm, and alternatively, about 10 nm and 200 nm.

In accordance with an exemplary aspect, the EML 350 may include inorganic luminescent particles such as QDs and/or QRs. Even if the LED 300 has high luminance by increasing current density or driving voltage, the inorganic luminescent particles are not degraded, so that the life span of the LED 300 may not be reduced.

The CTL2 360 is disposed between the EML 350 and the second electrode 320. The CTL2 360 may be an electron transfer layer which provides electrons into the EML 350. In one exemplary aspect, the CTL2 360 may include an electron injection layer (EIL) 362 disposed adjacently to the second electrode 320 between the second electrode 320 and the EML 350, and an electron transport layer (ETL) 364 disposed adjacently to the EML 350 between the second electrode 320 and the EML 350.

The EIL 362 facilitates the injection of electrons from the second electrode 320 into the EML 350. For example, the EIL 362 may include, but are not limited to, a metal such as Al, Cd, Cs, Cu, Ga, Ge, In and/or Li, each of which is undoped or doped with fluorine; and/or metal oxide such as titanium dioxide (TiO2), zinc oxide (ZnO), zirconium oxide (ZrO2), tin oxide (SnO2), tungsten oxide (WO3) and/or tantalum oxide (Ta2O3), each of which is undoped or doped with Al, Mg, In, Li, Ga, Cd, Cs or Cu.

The ETL 364 transfers electrons into the EML 350. In one exemplary aspect, when the EML 350 includes inorganic luminescent particles, the ETL 364 may include an inorganic material so as to prevent an interface defect from being formed at an interface between the EML 350 and the ETL 362, and thereby securing driving stability of the LED 300. In addition, when the ETL 364 includes an inorganic material having high charge mobility, the electron transport rate provided from the second electrode 320 may be improved, and electrons can be transported efficiently into the EML 350 owing to high electron levels or concentrations.

Moreover, when the EML 350 includes an inorganic luminescent particle, the inorganic luminescent particle typically has a very deep valence band (VB) energy level, which corresponds to a highest occupied molecular orbital (HOMO) energy level of an organic material, compared to a HOMO energy level of the organic luminous material. An organic compound having electron transporting property typically has a shallower HOMO energy level than the VB energy level of the inorganic luminescent particle. In this case, the holes, injected from the first electrode 310 into the EML 350 having the inorganic luminescent particles, may be leaked toward the second electrode via the ETL 364 including the organic compound as an electron transporting material.

In one exemplary aspect, the ETL 360 may include an inorganic material having relatively deep VB band energy level compared to VB band energy level or HOMO energy level of the material in the EML 350. As an example, an inorganic material having wide energy level bandgap (Eg) between the VB energy level and a conduction band energy level, which corresponds to a lowest unoccupied molecular orbital (LUMO) energy level of an organic compound, may be used as an electron transporting material of the ETL 364. In this case, the holes, injected from the first electrode 310 into the EML 350 having the inorganic luminescent particles, cannot be leaked to the ETL 364, and electrons provided from the second electrode 320 can be injected efficiently into the EML 350.

As an example, when the ETL 364 includes an inorganic material, the ETL 364 may include, but are not limited to, a metal oxide undoped or doped with at least one of Al, Mg, In, Li, Ga, Cd, Cs and Cu; a semiconductor particle undoped or doped with at least one of Al, Mg, In, Li, Ga, Cd, Cs and Cu; metal nitrides; and combination thereof.

In one exemplary aspect, the metal component of the metal oxide in the ETL 364 may be selected from, but are not limited to, zinc (Zn), calcium (Ca), magnesium (Mg), titanium (Ti), tin (Sn), tungsten (W), tantalum (Ta), hafnium (Hf), aluminum (Al), zirconium (Zr), barium (Ba) and combination thereof. Particularly, the metal oxide in the ETL 364 may include, but are not limited to, titanium dioxide (TiO2), zinc oxide (ZnO), magnesium zinc oxide (ZnMgO), zirconium oxide (ZrO2), tin oxide (SnO2), tungsten oxide (WO3), tantalum oxide (Ta2O3), hafnium oxide (HfO3), aluminum oxide (Al2O3), barium titanium oxide (BaTiO3), and barium zirconium oxide (BaZrO3), each of which is undoped or doped with Al, Mg, In, Li, Ga, Cd, Cs or Cu.

Other inorganic material in the ETL 364 may include, but are not limited to, a semiconductor particle such as CdS, ZnSe, ZnS, each of which is undoped or doped with Al, Mg, In, Li, Ga, Cd, Cs or Cu; nitrides such as Si3N4; and combination thereof.

Similar to the CTL1 340, while FIG. 2 illustrates the CTL2 360 as a bi-layered structure including the EIL 362 and the ETL 364, the CTL2 360 may have a mono-layered structure having only the ETL 364. Alternatively, the CTL2 360 may have a mono-layered structure of ETL 364 including a blend of the above-described electron-transporting inorganic material with cesium carbonate.

The CTL2 360, which includes the EIL 362 and/or the ETL 364 having the inorganic material, may be laminated on the EML 350 through solution process such as spin coating, drop coating, dip coating, spray coating, roll coating, flow coating, casting, screen printing and inkjet printing, or combination thereof. As an example, each of the EIL 362 and the ETL 364 may have a thickness, but are not limited to, between about 10 nm and about 200 nm, alternatively, about 10 nm and 100 nm.

For example, the LED 300 may have a hybrid charge transfer layer (CTL) in which the HTL 344 of the CTL1 340 includes the organic material as describe above and the CTL2 360, for example, the ETL 364 includes the inorganic material as described above. In this case, The LED 300 may enhance its luminous properties.

When holes are transported to the second electrode 320 through the EML 350, or electrons are transported to the first electrode 310 through the EML 350, the lifespan and efficiency of the LED 300 may be reduced. To prevent such deterioration, the LED 300 may further include at least one exciton blocking layer disposed adjacently to the EML 350.

For example, the LED 300 may include an electron blocking layer (EBL) capable of controlling and preventing the transfer of electrons between the HTL 344 and the EML 350. As an example, the EBL (not shown) may include, but are not limited to, TCTA, tris[4-(diethylamino)phenyl]amine), N-(biphenyl-4-yl)-9,9-dimethyl-N-(4-(9-phenyl-9H-carbazole-3-yl)phenyl)-9H-fluorene-2-amine, tri-p-tolylamine, 1,1-bis(4-(N,N'-di(ptolyl)amino)phenyl) cyclohexane (TAPC), m-MTDATA, 1,3-bis(N-carbazolyl) benzene (mCP), 3,3'-bis(N-carbazolyl)-1,1'-biphenyl (mCBP), Poly-TPD, copper phthalocyanine (CuPc), DNTPD and/or 1,3,5-tris[4-(diphenylamino)phenyl]benzene (TDAPB), and combination thereof.

In addition, a hole blocking layer (HBL), as a second exciton blocking layer, may be disposed between the EML 350 and the ETL 364 to prevent the transfer of holes between the EML 350 and the ETL 364. In one exemplary aspect, the HBL (not shown) may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the likes, which may be used for the ETL 464. For example, the HBL (not shown) may include, but are not limited to, 2,9-dimethyl-4,7-diphenyl-1,10-phenanthroline (BCP), BAlq, Alq3, PBD, spiro-PBD and/or Liq, which have/has a deeper HOMO energy level than that of the material used for the EML 350.

The LED 300 further includes the charge control layer (CCL) 370 disposed between the CTL2 360, which may be an electron transfer layer, and the second electrode 320. The charge control layer 370 may include polysiloxane-based material which chemically bonds to a surface of the CTL2 360. When the EIL 362 is omitted, the charge control layer 370 may be chemically bonded to a surface of the ETL 364, which includes an inorganic material, for example, metal oxide.

The charge control layer 370 is disposed between the CTL 2, which may be an electron transfer layer, and the second electrode 320 in FIG. 2. However, the charge control layer 370 may be disposed between the first electrode 310 and CTL1 340 when the CTL1 340 includes an inorganic material.

Figure 3:
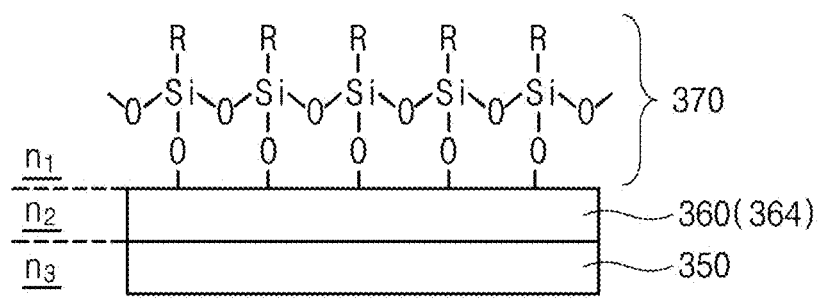
FIG. 3 is a schematic diagram illustrating an emitting material layer, a second charge transfer layer and a charge control layer in a light emitting diode in which refractive indices of those layers are indicated and polysiloxane-based material of the charge control layer is bonded chemically to a surface of the second charge transfer layer in accordance with the present disclosure.

Linkage relationships between the CTL2 360 and the charge control layer 370 and functions of the charge control layer 370 will be explained in more detail. FIG. 3 is a schematic diagram illustrating an emitting material layer, a second charge transfer layer and a charge control layer in a light emitting diode in which refractive indices of those layers are indicated and polysiloxane-based material of the charge control layer is bonded to a surface of the second charge transfer layer in accordance with the present disclosure.

As described above, it is possible to laminate or form the ETL 364 constituting the CTL2 360 by coating inorganic material such as metal oxide on the EML 350 through a solution process and then performing heating or drying step. There is oxide ion (O2-) or oxo anion (Oxy-) on the surface of the ETL 364 made of metal oxide of ionic solid. Those anions react with water under hydrophilic condition to be converted to hydroxyl group (—OH) or to form hydroxyl ion. In other words, a metal hydroxide (M-OH) is formed on the exposed surface of the ETL 364 made of metal oxide.

The oxide ion and the oxo anion as well as hydroxyl group derived from those ions formed on the surface of the ETL 364 made of metal oxide may cause surface defects in the ETL 364. For example, as oxide ion or oxo anion on the surface of the ETL 364 made of metal oxide is oxidized, metal oxide film is formed on the surface of the ETL 364. As a result, as the stability of the ETL 364 made of metal oxide is lowered, electrical properties such as electron mobility in the ETL 364 is reduced as time passed.

In contrast, the charge control layer 370 made of polysiloxane-based material can be chemically to the surface of the CTL2 360, for example, ETL 364 through oxane linkages in accordance with the present disclosure, as illustrated in FIG. 3. In one exemplary aspect, the polysiloxane-based material formed of the charge control layer 370 may be synthesized from the silane monomer having the structure of Chemical Formula 1:

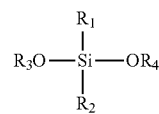

Chemical Formula 1

In Chemical Formula 1, each of R1 and R2 is independently is hydrogen, deuterium, tritium, hydroxyl group, linear or branched C1~C10 alkyl group, C2~C20 alkenyl group, C1~C10 alkoxy group, C1~C10 alkyl amino group, C1~C10 alkyl acryloxy group, C1~C10 methacryloxy group, $C_1$~$C_{10}$ alkyl methacryloxy group, thiol group, C1~C10 alkyl thiol group, isocyanate group, C1~C10 alkyl isocyanate group, epoxy group, C1~C10 alkyl epoxy group, C1~C10 alkylene epoxy group, C5~C20 cycloalkyl epoxy group, C5~C20 cycloalkylene epoxy group, C5~C30 aryl epoxy group, C5~C30 arylene epoxy group, C4~C30 hetero aryl epoxy group, C4~C30 hetero arylene epoxy group, glycidyloxy group, C1~C10 alkyl glycidyloxy group, C1~C10 alkylene glycidyloxy group, C5~C20 cycloalkyl glycidyloxy group, C5~C20 cycloalkylene glycidyloxy group, C5~C30 aryl glycidyloxy group, C5~C30 arylene glycidyloxy group, C4~C30 hetero aryl glycidyloxy group, C4~C30 hetero arylene glycidyloxy group, C5~C20 aryl group unsubstituted or substituted with at least one halogen, C4~C20 hetero aryl group unsubstituted or substituted with at least one halogen, C5~C20 aryloxyl group unsubstituted or substituted with at least one halogen, C4~C20 hetero aryloxyl group unsubstituted or substituted with at least one halogen, C5~C20 aryl amino group unsubstituted or substituted with at least one halogen or C4~C20 hetero aryl amino group unsubstituted or substituted with at least one halogen, respectively. Each of R3 and R4 is independently hydrogen, deuterium, tritium, linear or branched C1~C10 alkyl group, C1~C10 alkyl amino group, C5~C20 aryl group, C4~C20 hetero aryl group, C5~C20 aryl amino group or C4~C20 hetero aryl amino group, respectively.

In one exemplary aspect, linear or branched C1~C10 alkyl group of R1 to R4 may be linear or branched C1~C5 alkyl group. In another exemplary aspect, C5~C30 aryl group unsubstituted or substituted with at least one halogen in each of R1 to R4, may include independently, but are not limited to, unfused or fused aromatic group such as phenyl, biphenyl, terphenyl, tetraphenyl, naphthyl, anthracenyl, indenyl, phenalenyl, phenanthrenyl, azulenyl, pyrenyl, fluorenyl, tetracenyl, indacenyl and spiro-fluorenyl, each of which is unsubstituted or substituted with at least one halogen, respectively, and alternatively, phenyl, biphenyl, naphthyl, anthracenyl and indenyl.

In still another aspect, C4~C30 hetero aryl group unsubstituted or substituted with at least one halogen in each of R1 to R4, may include independently, but are not limited to, unfused or fused hetero aromatic group such as furanyl, thiophenyl, pyrrolyl, pyridinyl, pyrimidinyl, pyrazinyl, pyridazinyl, triazinyl, tetrazinyl, imidazolyl, pryazolyl, indolyl, carbazolyl, benzocarbazolyl, dibenzocarbazolyl, indolocarbazolyl, indenocarbazolyl, benzofuranocarbazolyl, benzothienocarbazolyl, quinolinyl, iso-quinolinyl, phthalazinyl, quinoxalinyl, cinnolinyl, quinazolinyl, benzoquinolinyl, benzoiso-quinolinyl, benzoquinazolinyl, benzoquinoxalinyl, acridinyl, phenathrolinly, furanyl, pyranyl, oxazinyl, oxaxolyl, iso-oxazolyl, oxadiazolyl, triazolyl, dioxinyl, benzofuranyl, dibenzofuranyl, thiopyranyl, thizainyl, thiophenyl, benzothiephenyl, dibenzothiophenyl, thiazolyl and iso-thiazolyl, each of which is unsubstituted or substituted with at least one halogen, respectively, and alternatively, pyridyl and pyrimidinyl.

As an example, R1 in Chemical Formula 1 may be hydrogen, deuterium, tritium, hydroxyl group, linear or branched C1~C10 alkyl group, C2~C10 alkenyl group, C1~C10 alkoxy group, C1~C10 alkyl amino group, C1~C10 alkyl acryloxy group, C1~C10 alkyl methacryloxy group, thiol group, C1~C10 alkyl thiol group, C1~C10 alkyl isocyanate group, C1~C10 alkyl glycidyloxy group or C5~C20 aryl group unsubstituted or substituted with at least one halogen. R2 may be hydroxyl group or C1~C10 alkoxy group. Each of R3 and R4 is independently may be hydrogen, deuterium, tritium or linear or branched C 1~C10 alkyl group, respectively.

In one exemplary aspect, the monomer, which can be synthesized to the polysiloxane-based material of the charge control layer 370, may have at least two, alternatively, at least three hydrolysable groups, for example, alkoxy group, aryloxy group unsubstituted or substituted with at least one halogen and/or hetero aryloxy group unsubstituted or substituted with at least one halogen, substituted to the center silicon. In other words, at least one of R1 and R2 in Chemical Formula 1 may be a hydrolysable group.

As an example, the monomer having the structure of Chemical Formula 1 may include, but are not limited to, alkoxy silanes having two or three alkoxy groups as the hydrolysable group. For example, the silanes having two alkoxy group may include, but are not limited, to, Dimethyldiethoxysilane (DMDES), Methyl(vinyl)diethoxysilane (MVDES), 3-Aminopropyl(methyl)diethoxysilane (APMDES), (3-Acryloxypropyl)methyldimethoxysilane (APDMS), 3-glycidoxylpropyl(methyl)diethoxysilane (GPMDES) and/or methyl(phenyl)diethoxysilane (MPDES).

In an alternative aspect, the silanes having three alkoxy group may include, but are not limited to, Methyltriethoxysilane (MTES), Ethyltriethoxysilane (ETES), n-propyltriethoxysilane (PTES), Octyltriethoxysilane (OTES), Vinyltriethoxysilane (VTES), 3-Aminopropyltrimethoxysilane (APTMS), 3-Aminopropyltriethoxysilane (APTES), 3-(2-Aminoethylamino)propyltrimethoxysilane (AEPTMS), (3-Acryloxypropyl)trimethoxysilane (APTMS), Methacryloxymethyltriethoxysilane (MMS), 3-Methacryloxypropyltrimethoxysilane (MPTMS), 3-Methacryloxypropyltriethoxysilane (MPTES), 3-Mercaptopropyltriethoxysilane (MPTES), 3-Isocyanatopropyltriethoxysilane (ICPTES), 2-(3,4-Epoxycyclohexyl)ethyltriethoxysilane (ECETMS), 3-Glycidyloxypropyltrimethoxysilane (GPTMOS), 3-Glycidyloxypropyltriethoxysilane (GPTEOS), Phenyltrimethoxysilane (PTES), (4-chlorophenyl)triethoxysilane (CPTES) and/or [3-(phenylamino)propyl]trimethoxysilane (PAPTMS).

As an example, as the silane monomer having at least three hydrolysable groups such as alkoxy group, aryloxy group unsubstituted or substituted with at least one halogen and/or hetero aryloxy group unsubstituted o substituted with at least one halogen among the silane monomers having the structure of Chemical Formula 1 is hydrolyzed, the silane monomer is converted to silanols having at least three hydroxyl groups. Two or three hydroxyl groups among the hydroxyl groups form polysiloxane through self-condensation reaction, rest one hydroxyl group is condensed to another hydroxyl group present on the surface of the ETL 364 so as to bond to the surface through oxane bonds.

As an example, the following Chemical Formula 2 illustrates a chemical bond between the polysiloxane-based material in the charge control layer 370 and the ETL 364 made of metal oxide when each of R2 to R4 is a hydrolysable group, respectively.

Chemical Formula 2

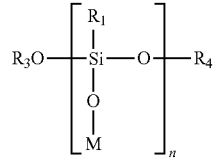

In Chemical Formula 2, each of R1, R3 and R4 is identical as defined in Chemical Formula 1. M indicates a metal component of metal oxide in the ETL 364 and may be selected from the group consisting of zinc (Zn), calcium (Ca), magnesium (Mg), titanium (Ti), tin (Sn), tungsten (W), tantalum (Ta), hafnium (Hf), aluminum (Al), zirconium (Zr), barium (Ba) and combination thereof, and n is a integer of 1 or more.

Chemical bonding between the charge control layer made of polysiloxane-based material and the surface of the CTL2 360, for example ETL 364 enables the surface defects on the ETL 364 to be removed. As a result, since the stability of the ETL 364 made of inorganic material such as metal oxide is maintained, the electrical properties such as electron mobility in the ETL 364 can be maintained in spite of time lapse and luminous efficiency of the LED 300 can be improved.

In an exemplary aspect, the charge control layer 370 may be formed on the CTL2 360, for example the ETL 364 through a solution process using solvent dispersing the silane monomer having the structure of Chemical Formula 1. The solvent, which can dispersing the silane monomer, may include an aliphatic alcohol-based solvent, an aliphatic ketone-based solvent, an ether-based solvent, an aliphatic ester-based solvent, an aliphatic or an aromatic amide-based solvent, an aliphatic hydrocarbon-based solvent, an aromatic hydrocarbon-based solvent, acetonitrile, an aliphatic sulfoxide-based solvent and combination thereof.

The alcohol-based solvent may include, but are not limited to, methanol, ethanol, isopropanol, propanol, butanol, n-propyl alcohol, ethylene glycol, propylene glycol, butandiol, neopentyl glycol, 1,3-pentandiol, 1,4-cyclohexanediol, diethylene glycol, polyethylene glycol, polybutylene glycol, dimethylol propane, trimethylol propane, sorbitol and esterfication products thereof.

The aliphatic ketone-based solvent may include, but are not limited to, acetone, diacetone alcohol (4-hydroxyl-4-methylpenthan-2-on), methylethyl ketone (MEK: butanone), and the likes. The ester-based solvent may include, but are not limited to, methyl cellosolve (2-methoxy ethanol), ethyl cellosolve (2-ethoxy ethanol), dibutyl ether, propylene glycol methyl ether (1-methoxy-2-propanol), tetrahydrofuran, mono- or poly-alkylene glycol dialkyl ether, and the likes. The aliphatic carboxylic ester-based solvent may include, but are not limited to, ethyl acetate, butyl acetate and the likes, and the aliphatic or aromatic amide-based solvent may include, but are not limited to, dimethylformamide (DMF), N-methyl-2-pyrrolidone (NMP), and the likes.

As an example, when alcohol-based solvent is used, the silane monomer may be diluted in about 3% to about 20% (w/v) in anhydrous alcohol in order to minimize reactions with moisture, but are not limited thereto. In one exemplary aspect, the charge control layer 370 may be formed by coating the solution including the silane monomer dispersed in the solvent on the CTL2 360, for example, the ETL 364 using a solution process and then evaporating the solvent by heating or drying. For example, the charge control layer 370 may be laminated by any solution process such as spin coating, drop coating, dip coating, spray coating, roll coating, flow coating, casting, screen printing and inkjet printing, or a combination thereof.

In one exemplary aspect, the charge control layer 370 made of polysiloxane-based material may be laminated having a thickness of, but not limited to, about 1 nm to about 5 nm, and alternatively, about 3 nm to about 5 nm. When the charge control layer 370 has a thickness of more than 5 nm, the charge control layer 370 may act as an insulating layer. In this case, while charge can transport through the charge control layer 370, the LED 300 may not be driven.

The EML 350 including the inorganic luminescent particles has a refractive index "n3" of about 1.70 to about 1.80. The ETL 364 made of inorganic material such as metal oxide having excellent electron mobility has a refractive index "n2" of about 1.8 to about 2.6, which is very high compared to the refractive index "n3" of the EML 350. When the LED 300 is a bottom-emission type, the light emitted from the EML 350 passes through the ETL 364 without refractions, because the ETL 364 is made of transparent material and has a relatively high refractive index (n2>n3). As a result, the light amount directed to the emission surface decreases, the out-coupling efficiency of the LED 300 may be deteriorated.

In contrast, the polysiloxane-based material, which is material chemically bonded to the surface of the ETL 364, has a refractive index "n1" of about 1.4 to about 1.65, which is very low compared to the refractive index 'n2" of the ETL 360 made of metal oxide. The larger the difference between the refractive indices between two adjacent media, the smaller the critical angle and the more the total reflection occurs. Light having an incident angle larger than a critical angle among the light passing through the ETL 364 having a high refractive index "n2" can be totally reflected by the charge control layer 370 having a relatively low refractive index "n1". Accordingly, the amount of light directed to the emissive surface of the LED 300, which may be the bottom-emission type, increases and the out-coupling efficiency of the LED 300 can be improved.

Figure 4:
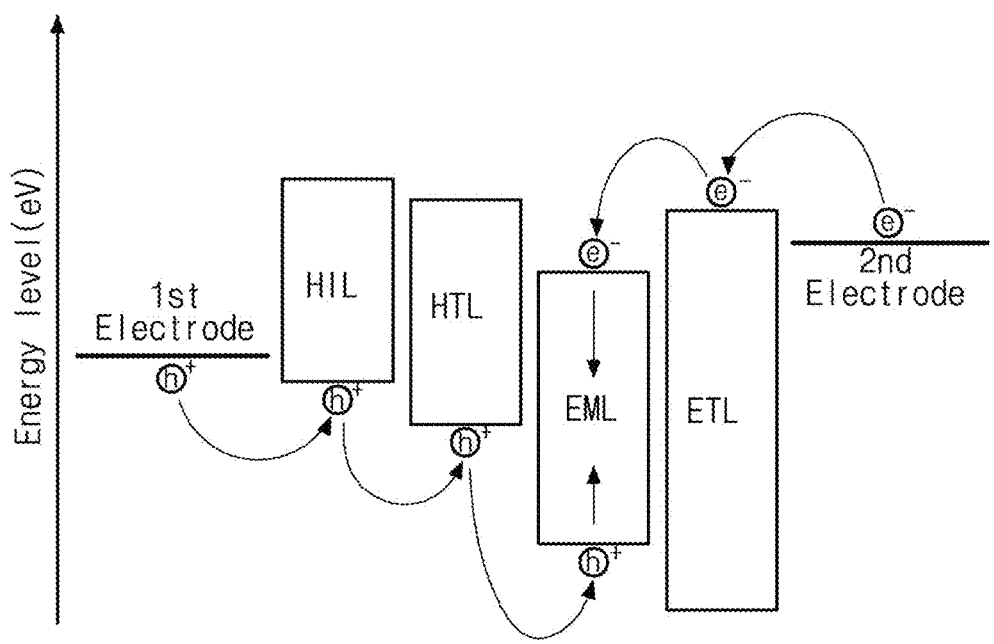
FIG. 4 is a schematic diagram illustrating energy levels among materials in an emitting unit and electrodes of the prior-art light emitting diode without a charge control layer.

In an exemplary aspect, the HTL 344 may be made of an organic material and the ETL 364 is made of an inorganic material in the LED 300. The inorganic material in the ETL 364 has higher charge mobility than the organic material in the HTL 344. Accordingly, as illustrated in FIG. 4, which is a schematic diagram illustrating energy levels among materials in an emitting unit and electrodes of the prior-art light emitting diode without a charge control layer, the electrons "$e_-$", provided by the second electrode 320, is injected rapidly from the ETL 364 made of inorganic material having excellent electron mobility into the EML 350. On the contrary, the holes "$h_+$", provide by the first electrode 310, is injected slowly from the HTL 344 made of organic material having relatively low hole mobility compared to the ETL material into the EML 350. Accordingly, the injection amount of electrons "$e_-$" is much more than the injection amount of holes "$h_+$" in the EML 350. Since the electrons and holes are not injected into the EML 350 in an unbalanced manner (charge un-balancing), excessively injected electrons are not recombined with holes without forming excitons and quenched without emissions (electron quenching). In addition, electrons "$e_-$" and holes "$h_+$" are not recombined in the inorganic luminescent particles or luminous organic materials within the EML 350, but recombined at an interface between the EML 350 and the HTL 344. As a result, the luminous efficiency of the LED 300 may be deteriorated.

Figure 5:
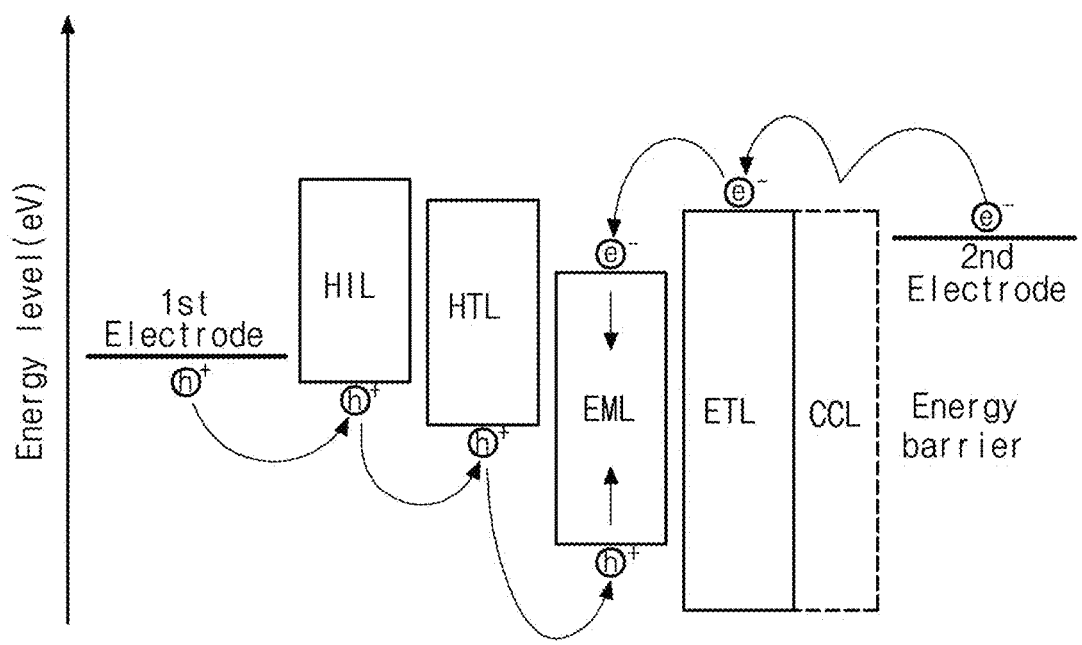
FIG. 5 is a schematic diagram illustrating energy levels among materials in an emitting unit and electrode in accordance with the present disclosure.

On the contrary, charges can be injected into the EML 350 in a balanced manner by forming the charge control layer 370 made of polysiloxane-based material linked to the surface of the CTL2 360, for example, the ETL 364. FIG. 5 is a schematic diagram illustrating energy levels among materials in an emitting unit and electrode in accordance with the present disclosure.

As illustrated in FIG. 5, the electrons "$e_-$", provided by the second electrode 320, must pass through the charge control layer (CCL) 370 prior to transporting to the ETL

364. The charge control layer (CCL) 370 made of polysiloxane-based material has a high conduction band energy level, and therefore may act as an energy barrier with regard to electron transportations. The charge control layer (CCL) 370 may reduce the amount of electrons "$\ominus_-$" provided into the ETL 364 from the second electrode 320 or make the electron "$\ominus_-$" injection rates into the ETL 364 slowly. As a result, the injection amount of electrons "$\ominus_-$" and the injection amount of holes "$\oplus_+$" into the EML 350 may be balanced. As the electrons "$\ominus_-$" and the holes "$\oplus_+$" are injected into the EML 350 in a balanced manner, the electrons "$\ominus_-$" and the holes "$\oplus_+$" injected into the EML 350 can recombine with each other in the EML 350 to form excitons without quenching. As a result, the luminous efficiency of the LED 300 can be enhanced.

Example 1: Fabrication of Electron Only Device Including Charge Control Layer

An electron only device (EOD) including a charge control layer was fabricated. An electron transport layer (ETL) of ZnO (thickness 30 nm) was laminated on a glass substrate coated with ITO as a lower electrode using a solution process and a charge control layer (CCL; thickness 3-5 nm) was laminated on the ETL. 3-aminopropyltriethoxysilane (APTES) diluted in 5% (w/v) in anhydrous ethanol was spin-coated on the ETL, and then the laminated film was left for 1 hour at room temperature so as to induce oxane bonds between the APTES and a surface of the ETL and siloxane bonds among APTES molecules. Al as an upper electrode (thickness 80 nm) was laminated on the CCL by deposition process to fabricate EOD.

Example 2: Fabrication of Electron Only Device Including Charge Control Layer

An EOD was fabricated by repeating the process as Example 1, except using ZnCaO in place of ZnO as ETL material.

Comparative Example 1: Fabrication of Electron Only Device Excluding Charge Control Layer An EOD was fabricated by repeating the process as Example 1, except without laminating the CCL (Ref. 1)

Comparative Example 2: Fabrication of Electron Only Device Excluding Charge Control Layer An EOD was fabricated by repeating the process as Example 2, except without laminating the CCL (Ref. 2).

Figure 6:
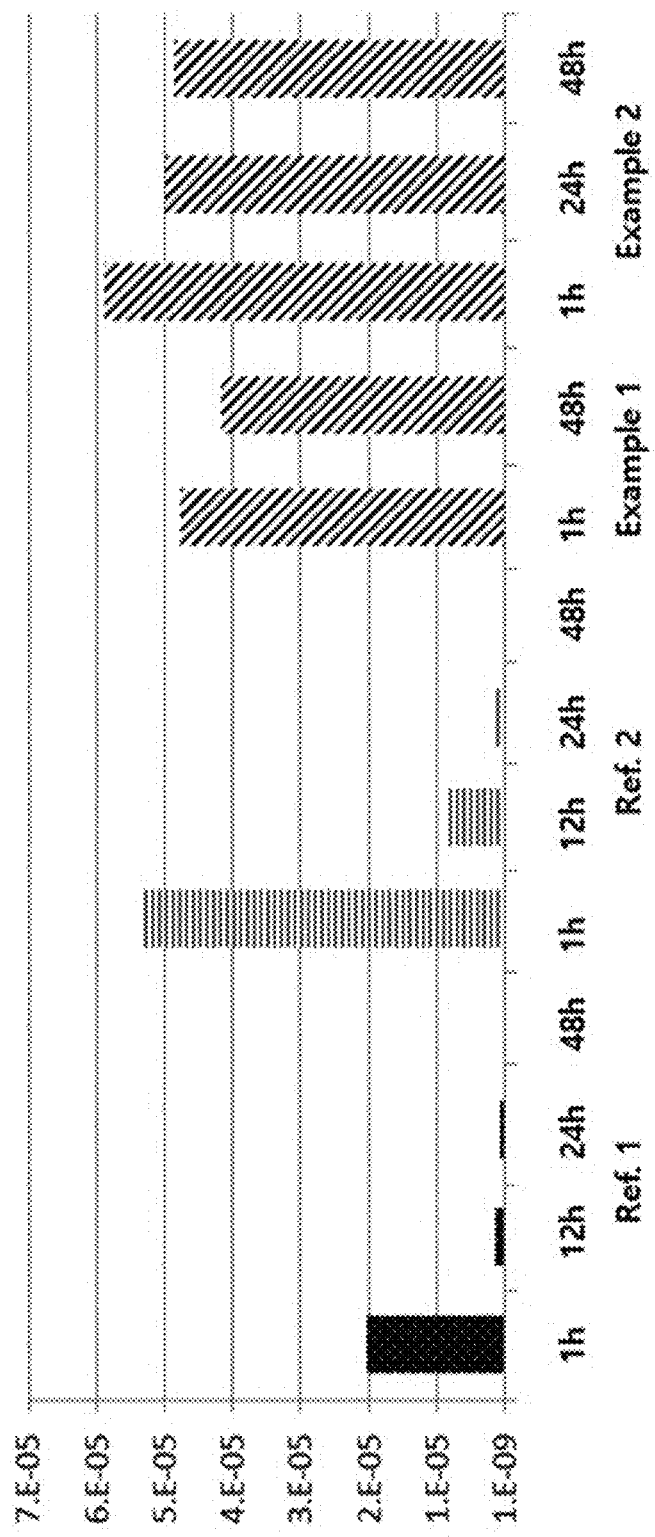
FIG. 6 is a graph illustrating an electron mobility with time in an electron only device (EOD) having a charge control layer measured in accordance with an Example of the present disclosure.

Experimental Example 1: Measurement of Physical Property of EOD (1) Measurement of Electron Mobility Electron mobility for each of the EOD fabricated in Examples 1-2 and Comparative Example 1-2 was measured. Electron mobility in each EOD after 1 hour, 12 hours, 24 hours and 48 hours was measured. Measurement results are indicated in the following table 1 and FIG. 6. In case of the EODs includes only ETL of metal oxide as Ref. 1 and 2, a metal oxide film is formed on the surface of ETL as an oxidation by O2- defect occurs on the surface of ETL consisting of metal oxide which is vulnerable to oxygen and moisture. As a result, as the electrical properties of the ETL are lowered, the electron mobility is rapidly reduced and the stability of the material is deteriorated. On the contrary, when the CCL is formed on the surface of the ETL as Examples 1 and 2, as the CCL enables the surface defects of the ETL to be removed, the stability of the material in ETL and good electron mobility was maintained despite the lapse of time.

TABLE 1

Electron Mobility in EOD

| Sample | Electron Mobility | | | |
|---|---|---|---|---|
| | 1 hour | 12 hours | 24 hours | 48 hours |
| Example 1 | 4.77769E−05 | — | — | 4.17769E−05 |
| Example 2 | 5.88201E−05 | — | 4.99411E−05 | 4.87478E−05 |
| Ref. 1 | 2.03398E−05 | 1.32957E−06 | 7.91E−07 | 9.28E−08 |
| Ref. 2 | 5.36262E−05 | 8.48E−06 | 1.12941E−06 | 1.02035E−7 |

(2) Measurement of Optical Property of EODs

Figure 7:
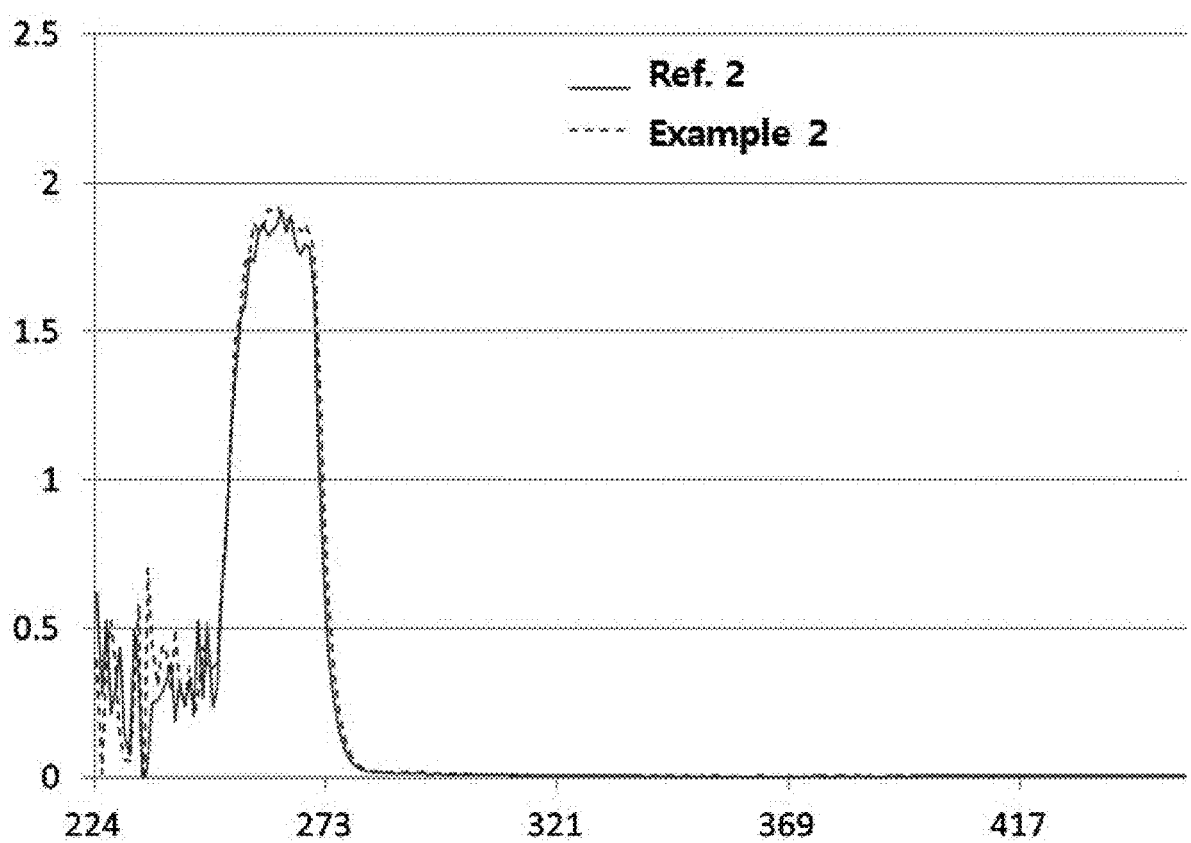
FIG. 7 is a graph illustrating a spectral absorption intensity with wavelengths in an electron only device having a charge control layer measured in accordance with an Example of the present disclosure.

Absorption degree according to wavelength ranges was analyzed by UV-VIS method for the EODs fabricated in Example 2 and Ref. 2. An absorption wavelength was designated to a light source using a quantum yield (QY) measurement equipment, and a wavelength for emitting light was detected by irradiating the designated light. Measurement result is indicated in the following table 2 and FIG. 7. Since ZnCaO as ETL material has a wide bandgap (absorption wavelength is 273 nm; emission wavelength is 380 nm), photoluminescence (PL) wavelengths were not detected in the equipment that can detect only wavelengths within the visible region. In spite of additionally forming, the CCL in Example 2, two EODs showed substantially identical absorption wavelengths. In addition, the energy level bandgap (Eg) between the valence band energy level (corresponding to HOMO energy level of the organic material) and the conduction band energy level (corresponding to LUMO energy level of the organic material) of the metal oxide constituting the ETL is little affected by the CCL. That is, although the CCL was laminated on the surface of the ETL, it was confirmed that the physical properties of the ETL made of metal oxide having the wide energy level bandgap were maintained.

TABLE 2

Optical Property of EODs

| Sample | Absorption wavelength (nm) | PL(nm) | Eg(eV) |
| --- | --- | --- | --- |
| Example 2 | 273 | — | 4.52 |
| Ref. 2 | 274 | — | 4.54 |

Experimental Example 2: Analysis of Film Components

Figure 8:
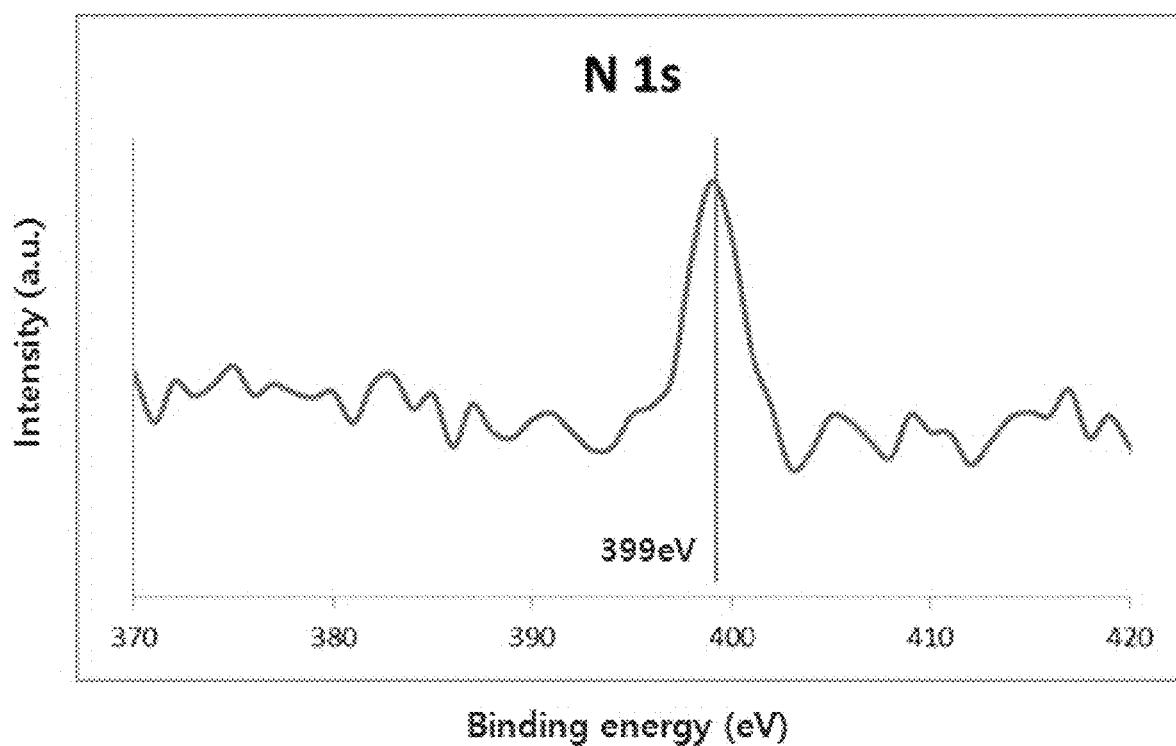
FIGS. 8 and 9 are graphs illustrating XPS (X-ray Photoelectron Spectroscopy) analysis results with regard to thin films only having an electron transport layer and a charge control layer by de-capping an electron only device measured in accordance with an Example of the present disclosure.
Figure 9:
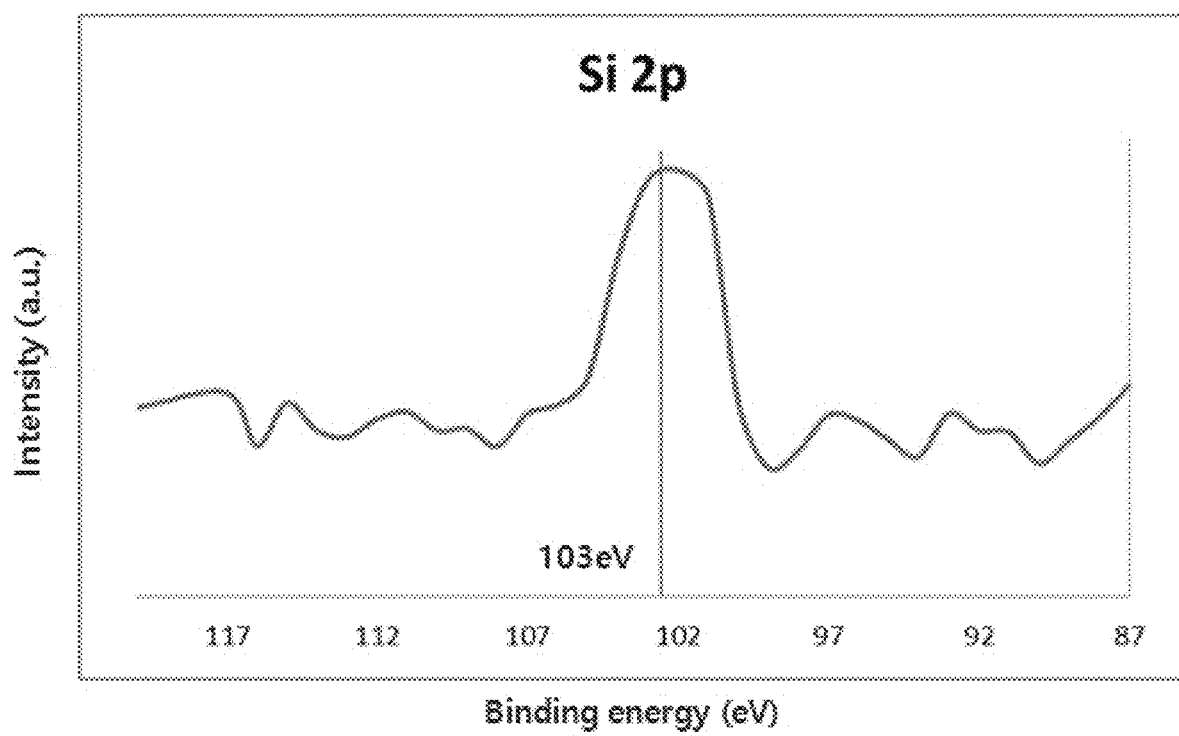
Figure 10:
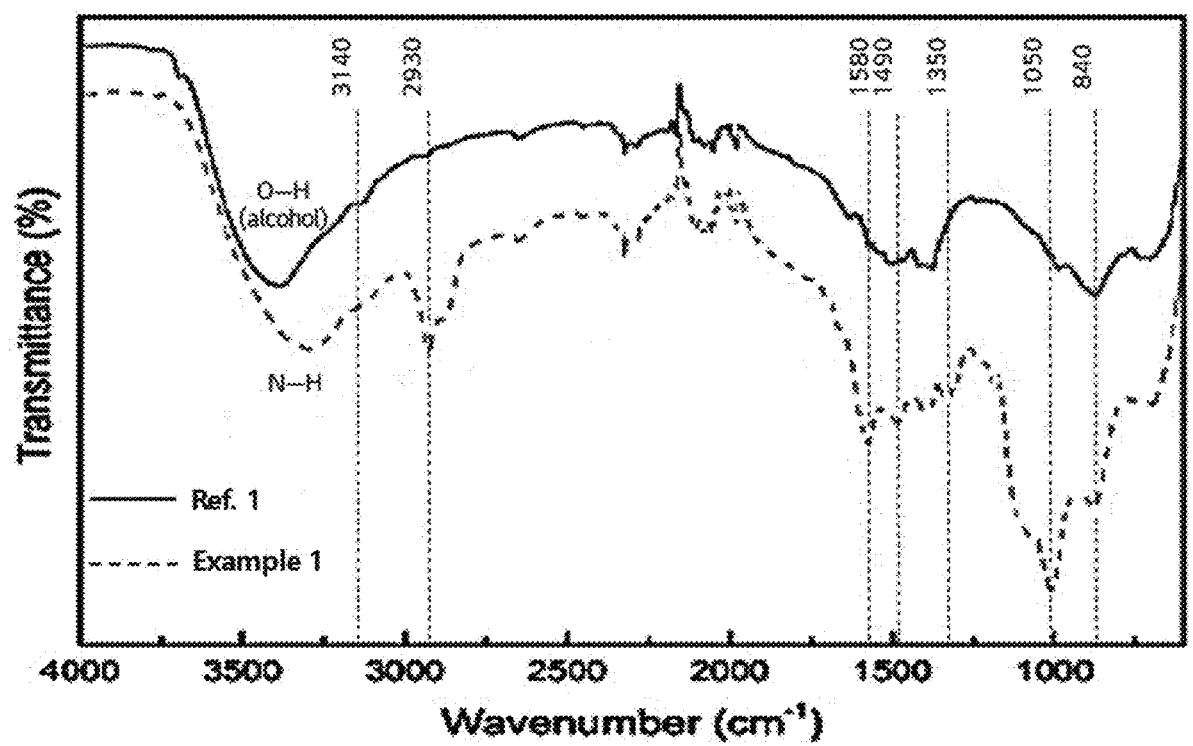
FIG. 10 is a graph illustrating FT-IR (Fourier transform Infrared Spectroscopy) analysis result with regard to thin films only having an electron transport layer and a charge control layer by de-capping an electron only device measured in accordance with an Example of the present disclosure.

Each of the EODs in Example 1 and Ref. 1 was de-capped to analyze components in the film consisting only of ETL-CCL (example 1) and ETL (Ref. 1). FIGS. 8 and 9 illustrate XPS (X-ray photoelectron spectroscopy) analysis results and FIG. 10 illustrates FT-IR (Fourier transform Infrared Spectroscopy) analysis result. As illustrated in FIGS. 8 and 9, each of an energy peak of functional group including nitrogen derived from APTES which is used for forming CCL (N is derived from amino group at the APTES terminal) and an energy peak formed by siloxane bonds between the surface of the ETL and APTES or by oxane bonds among APTES molecules (Si 2P) was detected in the ETL-CCL thin film constituting the EOD in Example 1. In addition, as illustrated in FIG. 10, unlike the thin film consisting of only the ETL of ZnO in Ref. 1, amino group, which is a part of APTES used for synthesizing polysiloxane-based material, was detected in the thin film including the CCL having polysiloxane-based material in Example 1. It was confirmed that hydroxyl group (—OH), which exists on the surface of the ETL, was detected in the thin film in Ref. 1.

Subsequently, the thin film consisting of ETL-CCL (Zn-CaO-polysiloxane) of Example 2 and the thin film consisting only of ETL (ZnCaO) were subjected to Inductively Coupled Plasma-Mass Spectroscopy (ICP-MS) and Inductively Coupled Plasma Optical Emission Spectroscopy (ICP-OES) so as to analyze the components in each film. It is possible to detect Mg, Al, Cr, Mn, Co, Ni, Ca, Ga, Cd, In and Ag (0.3 ppb to 10 ppb; detection limit is 1 ppb) by ICP-MS analysis, and to detect Na, In, Se, Zn, Mo, P, Si and N (200 ppb to 3000 ppb; detection limit is 10 ppb) by ICP-OES analysis. Each of the thin films in Example 2 and Ref. 2 was dissolved in nitric acid and subjected to sonication for 6 hours and then subject to pre-treatment of massing up to about 10,000 times using distilled water to detect the components in the thin films. Analysis result is illustrated in the following Table 3. As illustrated in Table 3, Si, which was not detected in the thin film of Ref. 2, was detected in the thin film of Example 2 including the CCL made of polysiloxane-based material. Also, nitrogen content in the thin film of Example 2 was greatly increased compared to the thin film of Ref. 2.

TABLE 3

Assay of Thin Film Components

| Ref. 2 (ETL only) | | | | Example 2(ETL + CCL) | | | |
| --- | --- | --- | --- | --- | --- | --- | --- |
| Elements | (%) | Elements | (%) | Elements | (%) | Elements | (%) |
| Mg | — | In | — | Mg | — | In | — |
| Al | — | Ag | — | Al | — | Ag | — |
| Cr | — | Se | — | Cr | — | Se | — |
| Mn | — | Zn | 21.6 | Mn | — | Zn | 19.3 |
| Co | — | Au | — | Co | — | Au | — |
| Ni | — | Mo | — | Ni | — | Mo | — |
| Ca | 2.7 | Na | 0.3 | Ca | 1.7 | Na | 0.3 |
| Ga | — | Si | — | Ga | — | Si | 3.2 |
| Cd | — | N | 0.9 | Cd | — | N | 4.9 |

—: reflects detection results of Blank experiment

Example 1: Fabrication of Light Emitting Diode (LED)

An ITO (50 nm)-glass was patterned to have luminous area 3 mm×3 mm and washed. And an emissive layer and cathode were laminated as the following order:

a hole injection layer (HIL) (PEDOT:PSS; water-borne spin coating (5000 rpm) for 60 seconds and heating for 30 minutes at 140° C., 20 nm); a hole transport layer (HTL) (HTS2310, PVK-based polymer; spin coating (4000 rpm) in toluene for 30 seconds and heating for 30 minutes at 170° C., 20 nm); an emitting material layer (EML) (LTG-1, green quantum dot of InP (core)/ZnSe/ZnS (shell); spin coating (2000 rpm) in octane for 45 second and heating, 20 nm); an electron transport layer (ETL) (ZnO; spin coating (3000 rpm) for 45 second and heating; 30 nm); a charge control layer (CCL) (APTES; spin coating in anhydrous ethanol and left; 3 nm).

And then, the ITO-glass substrate having the laminated emissive layer including CCL was transferred to a vacuum chamber, where a cathode (Al; 80 nm) was deposited under 10-6 Torr. After depositing the cathode, The LED was transferred from the vacuum chamber to a dry box for film formation, followed by encapsulation using UV-curable epoxy and moisture getter. The manufactured organic light emitting diode had an emission area of 9 mm2.

Examples 4~5: Fabrication of LED

An LED was fabricated by repeating the same process and the same material as Example 3, except using ZnMgO (Example 4) or ZnCaO (Example 5) in place of ZnO as an ETL material.

Example 6: Fabrication of LED

An LED was fabricated by repeating the same process and the same material as Example 3, except using ZnCaO in place of ZnO as an ETL material and adjusting the thickness of CCL to 5 nm.

Comparative Examples 3~5: Fabrication of LED

An LED was fabricated by repeating the same process and the same material as Example 3, except without the CCL. ZnO (Comparative Example 3, Ref. 3), ZnMgO (Comparative Example 4, Ref. 4) or ZnCaO (Comparative Example 5, Ref. 5) was used as the ETL material, respectively.

Experimental Example 3: Analysis of LED Structure

Figure 11:
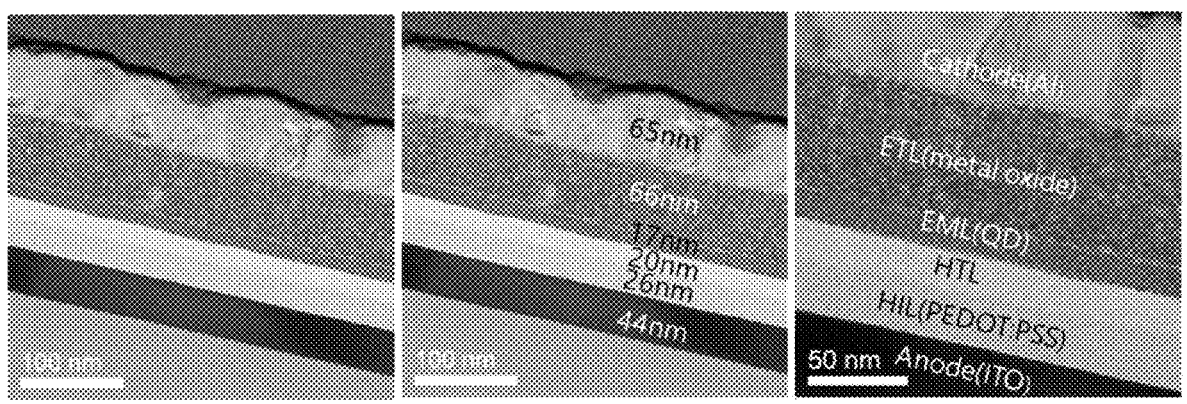
FIG. 11 is a TEM image illustrating a laminated structure of a light emitting diode without a charge control layer in accordance with a Comparative Example.
Figure 12:
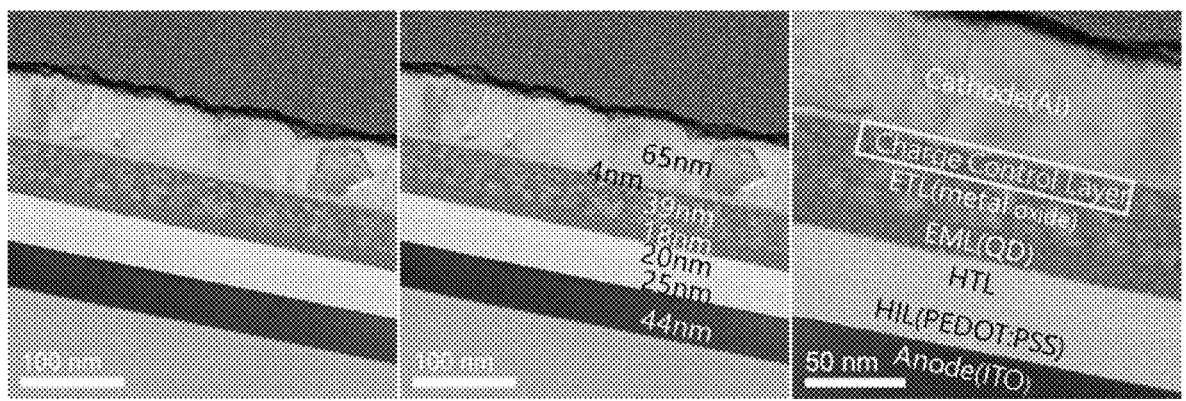
FIG. 12 is a TEM image illustrating a laminated structure of a light emitting diode having a charge control layer in accordance with an Example of the present disclosure.

The cross-sectional structures of LEDs fabricated in Ref. 5 and Example 5 were analyzed with TEM. FIG. 11 is a TEM image illustrating the cross-sectional structure of the LED fabricated in Ref. 5 and FIG. 12 is a TEM image illustrating the cross-sectional structure of the LED fabricated in Example 5. The LED fabricated in Example 5 formed the CCL between the ETL and the cathode.

Experimental Example 4: Evaluation of Luminous Properties of LED

Each of the light emitting diode fabricated in Examples 3 to 6 and Refs. 3 to 5 was connected to an external power source and then luminous properties for all the diodes were evaluated using a constant current source (KEITHLEY) and a photometer PR650 at room temperature. In particular, current efficiency (cd/A), power efficiency (lm/W), external quantum efficiency (EQE; %), luminescence (cd/m2), and color coordinates for emission wavelength at a current 0.90 mA and a current density of 10 mA/cm2 of the light emitting diodes of Examples 3 to 6 and Ref. 3 to 5 were measured. The results thereof are shown in the following Table 4.

TABLE 4

| Luminous Property of LED | | | | | |
|---|---|---|---|---|---|
| Sample | cd/A | lm/W | EQE | cd/m$^2$ | CIEx | CIEy |
| Ref. 3 | 1.85 | 1.68 | 0.49 | 185.30 | 0.3358 | 0.6412 |
| Example 3 | 2.36 | 1.68 | 0.65 | 236.10 | 0.3617 | 0.6203 |
| Ref. 4 | 1.97 | 1.19 | 0.58 | 196.90 | 0.2544 | 0.6355 |
| Example 4 | 4.95 | 3.32 | 1.37 | 494.80 | 0.2772 | 0.6645 |
| Ref. 5 | 2.38 | 1.92 | 0.96 | 237.90 | 0.2088 | 0.3802 |
| Example 5 | 5.44 | 3.32 | 1.54 | 543.90 | 0.2637 | 0.6655 |
| Example 6 | 5.64 | 2.76 | 1.66 | 564.40 | — | — |

As indicated in Table 4, each of the LEDs applying CCL by Examples 3 to 6 had enhanced current efficiency, power efficiency, EQE and luminescence. Particularly, compared with the LED including only ETL of ZnO in Ref. 3, the LED further including the CCL in Example 3 improved its current efficiency, EQE and luminescence by 27.6%, 32.7% and 27.4%, respectively. Also, compared with the LED including only ETL of ZnMgO in Ref. 4, the LED further including the CCL in Example 4 improved its current efficiency, power efficiency, EQE and luminescence by 151.2%, 179.0%, 136.2% and 151.3%, respectively. In addition, compared with the LED including only ETL of ZnCaO in Ref. 5, the LED further including the CCL in Example 5 improved its current efficiency, power efficiency, EQE and luminescence by 128.6%, 72.9%, 60.4% and 128.6%, respectively. Moreover, even when the thickness of the CCL increases to 5 nm, it is possible to fabricate LED having improved luminous efficiency (Example 6). Accordingly, it is possible to realize an LED having enhanced luminous efficiency and out-coupling efficiency by laminating a charge control layer, which can be bonded to a surface of an electron transport layer through oxane bonds, and therefore the LED can be applied to a light emitting device.

While the present disclosure has been described with reference to exemplary aspects and examples, these aspects and examples are not intended to limit the scope of the present disclosure. Rather, it will be apparent to those skilled in the art that various modifications and variations can be made in the present disclosure without departing from the spirit or scope of the disclosure. Thus, it is intended that the present disclosure covers the modifications and variations of the present disclosure provided they come within the scope of the appended claims and their equivalents.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A light emitting diode, comprising:
   first and second electrodes facing each other;
   an emitting material layer disposed between the first and second electrodes;
   a first charge transfer layer disposed between the first electrode and the emitting material layer;
   a second charge transfer layer disposed between the emitting material layer and the second electrode and including an inorganic material; and
   a charge control layer,
   wherein the charge control layer includes a polysiloxane-based material that is chemically bonded to a surface of the second charge transfer layer, and
   wherein the second charge transfer layer includes an electron transport layer disposed between the emitting material layer and the second electrode and an electron injection layer disposed between the electron transport layer and the second electrode.

2. The light emitting diode of claim 1, wherein the charge control layer is disposed between the electron injection layer and the second electrode.

3. The light emitting diode of claim 1, wherein the charge control layer is laminated with a thickness of about 1 nm to about 5 nm.

4. The light emitting diode of claim 1, wherein the charge control layer has a refractive index that is less than a refractive index of the electron transport layer.

5. The light emitting diode of claim 1, wherein the polysiloxane-based material is synthesized from a monomer having the following structure of Chemical Formula 1:

Chemical Formula 1

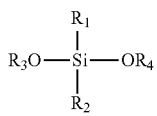

wherein each of R1 and R2 is independently is hydrogen, deuterium, tritium, hydroxyl group, linear or branched C1~C10 alkyl group, C2~C20 alkenyl group, C1~C10 alkoxy group, C1~C10 alkyl amino group, C1~C10 alkyl acryloxy group, C1~C10 methacryloxy group, C1~C10 alkyl methacryloxy group, thiol group, C1~C10 alkyl thiol group, isocyanate group, C1~C10 alkyl isocyanate group, epoxy group, C1~C10 alkyl epoxy group, C5~C20 cycloalkyl epoxy group, C5~C30 aryl epoxy group, C4~C30 hetero aryl epoxy group, glycidyloxy group, C5~C30 alkyl glycidyloxy group, C5~C20 aryl group unsubstituted or substituted with at least one halogen, C4~C20 hetero aryl group unsubstituted or substituted with at least one halogen, C5~C20 aryloxy group unsubstituted or substituted with at least one halogen, C4~C20 hetero aryloxy group unsubstituted or substituted with at least one halogen, C5~C20 aryl amino group unsubstituted or substituted with at least one halogen or C4~C20 hetero aryl amino group unsubstituted or substituted with at least one halogen, respectively; each of R3 and R4 is independently hydrogen, deuterium, tritium, linear or branched C1~C10 alkyl group, C1~C10 alkyl amino group, C5~C20 aryl group, C4~C20 hetero aryl group, C5~C20 aryl amino group or C4~C20 hetero aryl amino group, respectively.

6. The light emitting diode of claim 5, wherein R1 in Chemical Formula 1 is hydrogen, deuterium, tritium, hydroxyl group, linear or branched C1~C10 alkyl group, C2~C10 alkenyl group, C1~C10 alkoxy group, C1~C10 alkyl amino group, C1~C10 alkyl acryloxy group, C1~C10 alkyl methacryloxy group, thiol group, C1~C10 alkyl thiol group, C1~C10 alkyl isocyanate group, C1~C10 alkyl glycidyloxy group or C5~C20 aryl group unsubstituted or substituted with at least one halogen; R2 is hydroxyl group or C1~C10 alkoxy group; each of R3 and R4 is independently is hydrogen, deuterium, tritium or linear or branched C1~C10 alkyl group, respectively.

7. The light emitting diode of claim 1, wherein the inorganic material of the electron transport layer includes at least one of a metal oxide a semiconductor particle and metal nitrides.

8. The light emitting diode of claim 7, wherein the metal oxide includes an oxide of metal selected from the group consisting of zinc (Zn), calcium (Ca), magnesium (Mg), titanium (Ti), tin (Sn), tungsten (W), tantalum (Ta), hafnium (Hf), aluminum (Al), zirconium (Zr), barium (Ba) and combination thereof.

9. The light emitting diode of claim 1, wherein the emitting material layer includes inorganic luminescent particles.

10. A light emitting device, comprising:
a substrate; and
a light emitting diode according to claim 1 disposed on the substrate.

11. The light emitting diode of claim 1, wherein the polysiloxane-based material is chemically bonded to the surface of the second charge transfer layer through an oxygen atom.

12. The light emitting diode of claim 1, wherein the polysiloxane-based material has a reflective index between about 1.4 and about 1.65.

13. The light emitting diode of claim 1, wherein the inorganic material of the electron injection layer includes at least one of a metal and a metal oxide.

14. The light emitting diode of claim 13, wherein the metal is selected from the group consisting of aluminum (Al), cadmium (Cd), cesium (Cs), gallium (Ga), germanium (Ge), indium (In), lithium (Li) and combination thereof.

15. The light emitting diode of claim 13, wherein the metal oxide is selected from the group consisting of titanium dioxide ($TiO_2$), zinc oxide (ZnO), zirconium oxide ($ZrO_2$), tin oxide ($SnO_2$), tungsten oxide ($WO_3$), tantalum oxide ($Ta_2O_3$) and combination thereof.

16. The light emitting diode of claim 1, wherein the first charge transfer layer includes a hole transport layer.

17. The light emitting diode of claim 16, wherein the first charge transfer layer further includes a hole injection layer disposed between the first electrode and the hole transport layer.

* * * * *